June 2, 1970 — YOICHI KANEKO ET AL — 3,516,017

MICROWAVE SEMICONDUCTOR DEVICE

Filed June 7, 1968 — 4 Sheets-Sheet 1

INVENTORS
YOICHI KANEKO, RYOKA SAWADA,
SHINYA IIDA, KAZUO KAWAGUCHI

BY Craig & Antonelli
ATTORNEYS

INVENTORS
YOICHI KANEKO, RYOKA SAWADA,
SHINYA IIDA, KAZUO KAWAGUCHI

BY Craig & Antonelli

ATTORNEYS

INVENTORS
YOICHI KANEKO, RYOKA SAWADA,
SHINYA IIDA, KAZUO KAWAGUCHI

BY Craig & Antonelli
ATTORNEYS

INVENTORS
YOICHI KANEKO, RYOKA SAWADA
SHINYA IIDA, KAZUO KAWAGUCHI

BY Craig & Antonelli
ATTORNEYS 3,516,017
Patented June 2, 1970

3,516,017
MICROWAVE SEMICONDUCTOR DEVICE

Yoichi Kaneko and Ryoka Sawada, Kokubunji-shi, Shinya Iida, Hino-shi, and Kazuo Kawaguchi, Yokohama, Japan, assignors to Hitachi, Ltd., Tokyo, Japan, a corporation of Japan Filed June 7, 1968, Ser. No. 735,358
Claims priority, application Japan, June 14, 1967, 42/37,576
Int. Cl. H03b 7/00
U.S. Cl. 331—107 9 Claims

ABSTRACT OF THE DISCLOSURE

A solid electronic device provided with a semiconductor element joined to a heat sink and generating or controlling microwaves, the central portion of the element body being substantially removed and an active region being formed only in the peripheral portion of the element body. The thermal resistance from the active region to the heat sink is lowered and the dissipation is improved and also microwaves are distributed in the active region relatively uniformly, so a high efficiency is obtained.

This invention relates to a solid electronic device generating or controlling an electromagnetic wave in the microwave region.

The Gunn oscillator generates microwaves with relatively high efficiency in the X band or higher frequency band. As is well-known, this oscillator is operated by applying an electric field of a few thousand volts/cm. to a GaAs monocrystalline piece having a suitable resistivity, application of such a high field and a current flow thereby generated cause a loss of electric power of some millions watts/cm.³ inside the crystal piece. The power loss is transformed into heat and raises the temperature of the crystal. Especially during continuous operation a large quantity of heat is generated. Unless heat is sufficiently dissipated, the element suffers from deterioration and burning. Therefore, the electric power introduced into and derived out of the element is governed by the dissipated.

In the past, a metal block having a large heat capacity and thermal conductivity was joined to the end surface of the element containing the monocrystalline piece to serve as heat sink and as electrode. The generated quantity of heat was dissipated by thermal conduction. However, this structure could not dissipate sufficient heat in the case of a large element for high input and output levels. So, only a small element could be provided.

The reason is the following: in the case of a circular disc element, for example, the thermal resistance of conduction from the element to the metal block decreases in inverse proportion to an increase of the radius of the element while the quantity of heat generated in the element increases in production to the square of the radius. Therefore, as the increase of radius, the increase in quantity of generated heat surpasses the decrease of thermal resistance, the temperature of the element is increased.

A principal object of this invention is to provide a microwave solid device in which the thermal resistance from the element to a heat sink is made to be small without mounting a special radiation means, and so the element can operate in high input and output levels.

Another object of this invention is to provide a microwave solid device providing good mutual interaction between the element and microwaves and having a high efficiency.

A further object of this invention is to provide a microwave solid device which is easily fabricated and constructed mechanically strong.

Briefly speaking, this invention attaining the above objects consists in a microwave semiconductor device in which a heat sink is joined to a semiconductor element body having a layer interacting with the microwaves, and having a region interrupting substantially the current flowing through the element body during operation at least in the central portion of the element. An active region interacting with microwaves during operation is formed in the peripheral portion of the element body.

According to this invention, the substantially hollow active region formed around the element has a smaller thermal resistance against the heat sink than that of the prior art device, the quantity of heat generated in the region being dissipated more effectively to the heat sink so that the temperature rise of the element is made to be small. The microwave electric field is distributed relatively uniformly in the hollow active region so that an effective mutual interaction is attained.

The features, details and advantages of this invention will be made more apparent by the following explanation taken in conjunction with the accompanying drawings, in which like reference numerals are used to denote corresponding parts.

As described above, this invention provides a device equipped with an element having a substantially hollow active region and joined to a heat sink. In operation the active region interacts mutually with microwaves. The quantity of heat generated in this region is conducted and radiated to the heat sink.

Detailed explanation will be made of the heat radiation in the case of a ring-like element as a typical example.

When the heat sink is much larger than the junction with the element, heat flowing from the heat source, i.e. from the element to the heat sink, is conducted three-dimensionally in the heat sink.

Figure 1:
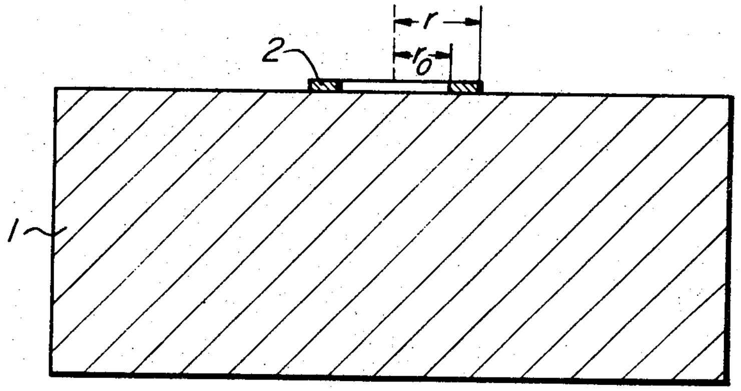
FIG. 1 is a transverse sectional view of an arrangement of a ring-like heat source joined to a heat sink, explaining the principle of this invention.
Figure 2:
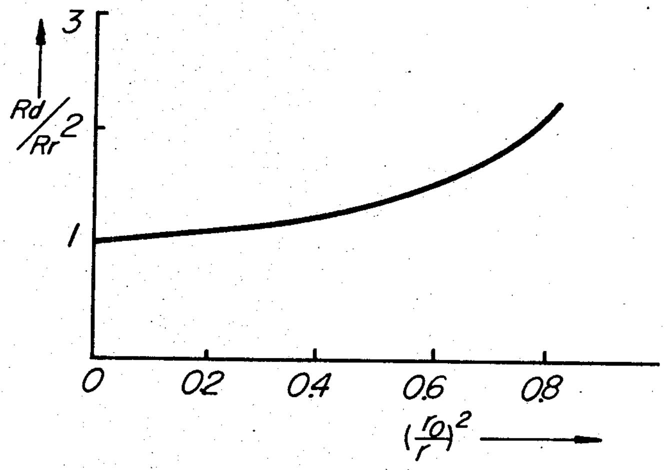
FIG. 2 is a curve showing the variation of thermal resistance when the inner and outer radii of the ring are varied with the area of the ring kept constant.

The experimental results of thermal resistance are as follows. In FIG. 1, a ring-like heat source having an inner radius $r_0$ and an outer radius $r$ was joined to a heat sink 1. The inner and outer radii were varied while the cross-sectional area $\pi(r^2-r_0^2)$ was kept constant. FIG. 2 shows the variation of thermal resistance related to the variation of the inner and outer radii. The abscissa indicates the square of the radius ratio $r_0/r$, and the ordinate the inverse thermal resistance R$r$ times the thermal resistance R$d$ of a circular disc having the same cross-sectional area.

As evident from this figure, when $r$ and $r_0$ are varied while the cross-sectional area $\pi(r^2-r_0^2)$ is kept constant, the thermal resistance R$r$ of a ring-like element becomes smaller than that of a circular disc $r_0=0$. As $r_0/r$ is larger and the difference between $r$ and $r_0$ is smaller, namely as the ring element has a smaller width and a larger size, the thermal resistance becomes smaller.

Therefore, when heat is generated corresponding to the cross-sectional area, the element is preferably ring-like. In this case, the dissipation of heat to a heat sink becomes larger in comparison with that of a disc-like element having the same cross-sectional area, and the temperature of the element can be decreased. Due to the small thermal resistance a ring-like element having a small width and a large size, even though the cross-section and hence the quantity of generated heat, are large, makes the rise in temperature of the same order as a circular disc having a smaller quantity of generated heat.

In the following description an example of the structure of a Gunn oscillator to which this invention is applied will be shown together with some embodiments of this invention.

Figure 3:
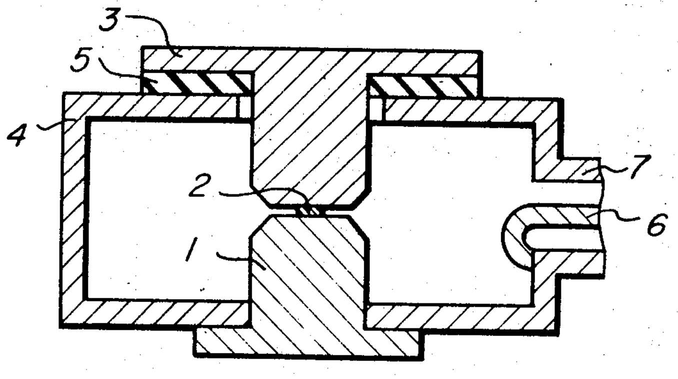
FIG. 3 is a longitudinal sectional view of the structure of a solid oscillator embodying this invention.

FIG. 3 shows a Gunn oscillator generating microwaves. One end surface of a semiconductor element body 2 is joined to one end of an electrode 1 constituting a heat sink while the opposite end surface of the element body 2 is joined to one end surface of another electrode 3.

The electrodes 1 and 3 penetrate a wall 4 of the cavity resonater so that their end surfaces oppose each other. The electrode 1 is directly in electrical and mechanical connection with the wall 4. The electrode 3 is insulated from the wall 5 in the D.C. sense by an insulator 5. The combination of the insulator 5 and a flange of the electrode 3 prevents the high frequency energy from being lost from the resonator.

The microwave energy generated in the element body by application of a D.C. voltage from an external power source (not shown) is derived out of the cavity by a loop 6 and supplied to a load through a coaxial wave guide 7.

Figure 4:
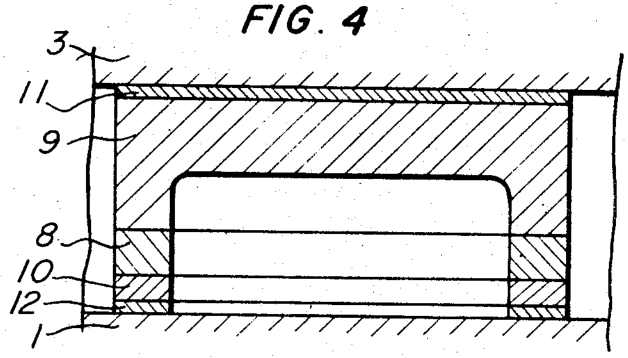
FIGS. 4 and 5 are longitudinal sectional views showing different embodiments of this invention.

FIG. 4 is an enlarged longitudinal sectional view of the element body 2, which is made of N type GaAs and has a sandwich structure. 8 is a ring-like GaAs layer having a resistivity of 1Ωcm., 9 a column of GaAs layer having a resistivity of a few mΩcm., one portion of which is a cylinder, and 10 is a ring-like GaAs layer having a resistivity of a few mΩcm.

The end portions of the layers 9 and 10 are respectively in ohmic contact with electrode layers 11 and 12 made by heat treatment after nickel plating. To the electrodes 3 and 1 are joined the electrode layers 11 and 12 respectively, the former being only in contact with the electrode 3 for mounting the arrangement but the latter being fixed to the electrode 1.

The element body is easily obtained by using the photoresist technique, i.e. masking the periphery of one end surface of the element and etching the other portion.

In the case of mass production, the element body is easily fabricated by etching the central portion of each element and thereafter masking the element to etch the other portion.

During operation the low resistivity layers 9 and 10 become substantially conducting layers while the high resistivity layer 8 becomes an active region. Since this layer 8 is ring-like, the heat generated therein is conducted through the low resistivity ring layer 10 and the electrode layer 12, and dissipated towards the electrode 1 with a relatively low thermal resistance.

Therefore according to this embodiment, the cross-section of the active region can be increased while its rise in temperature is suitably maintained so that a device having a large input and output can be constituted.

Since the microwave electric field is distributed relatively uniformly in the ring-type active region having a small width, conversion of a D.C. input given to the element to microwaves is uniformly done throughout the entire region, and a high efficiency oscillation is obtained.

Although in this embodiment the low resistivity layer 10 and the high resistivity layer 8 of the column type element having a sandwich structure are of the ring-type, the central portion of the sandwich may be entirely removed to form a cylindrical element. This yields a performance similar to that of the above embodiment.

Figure 5:
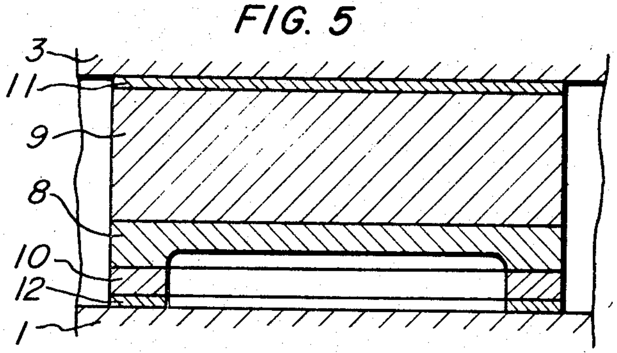

FIG. 5 shows another embodiment, in which the central portion of the low resistivity layer 10 of the sandwich type element is removed by etching to form a ring. According to this structure, the distribution of the current flowing through the high resistivity layer 8 is restricted substantially in the peripheral portion to form a ring-type active region. Substantially the same operation and advantages as those of the embodiment shown in FIG. 4 are obtained thereby.

In FIG. 5, a groove may be formed in the central portion of the high resistivity layer 8 to deposit directly the ring-like electrode layer 12, while the low resistivity layer 10 is omitted. Furthermore, in this embodiment, a ring-type active region as shown in the above embodiment is formed.

In the above embodiment when the cross-section of the central hollow portion is small, the element does not differ substantially from a circular disc element. However, when it reaches 40% of the entire cross-section, the thermal resistance from the element to the electrode becomes 80% of that of a circular disc element with an active region of the same cross-section. Therefore, the advantages of this invention are substantially recognized.

Figure 6:
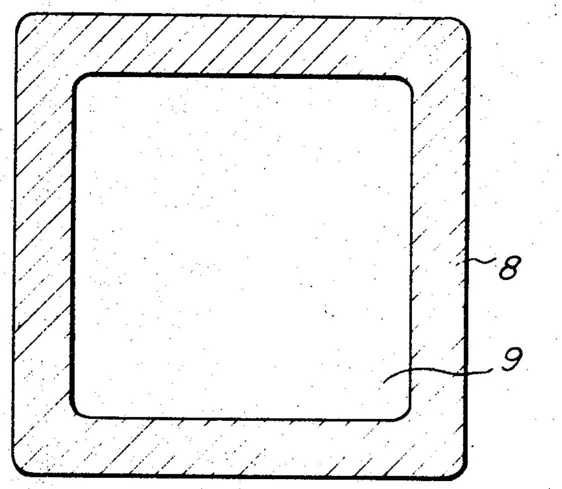
FIGS. 6 and 7 are transverse sectional views showing embodiments different from the above embodiments and different from each other.

FIG. 6 is a lateral cross-sectional view of a high resistivity layer 8 according to an embodiment, in which a square pillar type element having a sandwich structure has a hollow central portion.

Figure 7:
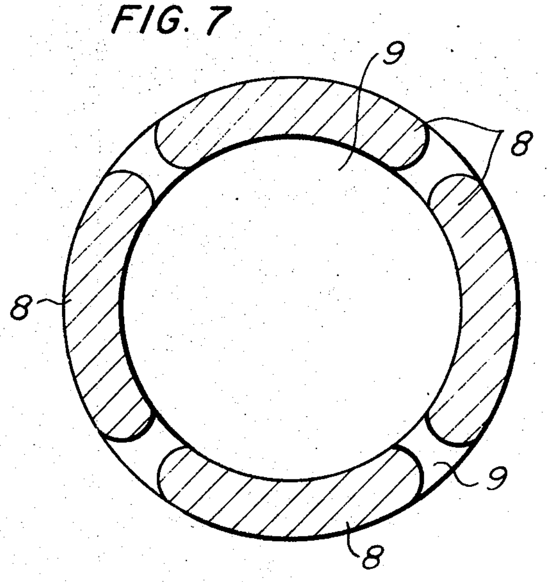

FIG. 7 is a lateral cross-sectional view of a high resistivity layer 8 according to another embodiment, in which a column type element with a sandwich structure is hollowed in the central portion together with a portion of the ring-type member.

These two embodiments in which the active region is formed in the peripheral portion, have an advantage similar to that of the foregoing embodiments.

Although in the above embodiments the central portion of the element is at least partially removed and the active region is formed in the peripheral portion, other embodiments as will be shown hereinafter are possible, in which the active region is formed in the peripheral portion without removing the central portion of the element.

Figure 8:
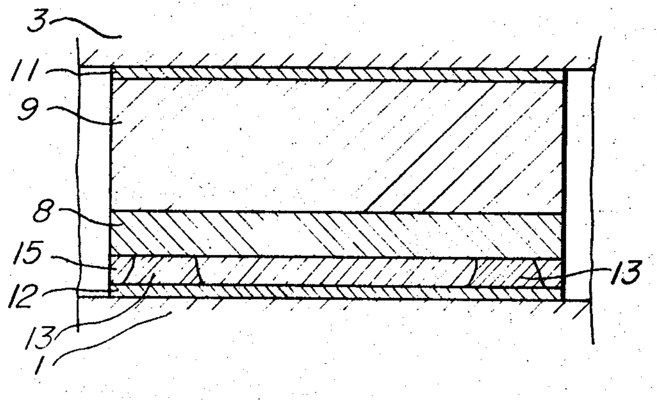
FIGS. 8 and 9 are longitudinal sectional views of embodiments of this invention different from the above embodiments and different from each other.

FIG. 8 is a longitudinal view of a further embodiment, in which a ring-like current path is joined to the high resistivity layer of a column type element having a sandwich structure. 9, 8 and 15 are low resistivity layers and high resistivity layers of N type GaAs respectively. The high resistivity layer 15 is provided with an $N^+$ layer 13 formed for example by diffusion. During operation the high resistivity layer 15 acts substantially as an insulating layer and the current flows through the ring-like $N^+$ layer 13. So, a ring-type active region corresponding to the $N^+$ layer is formed in the high resistivity layer 8.

Figure 9:
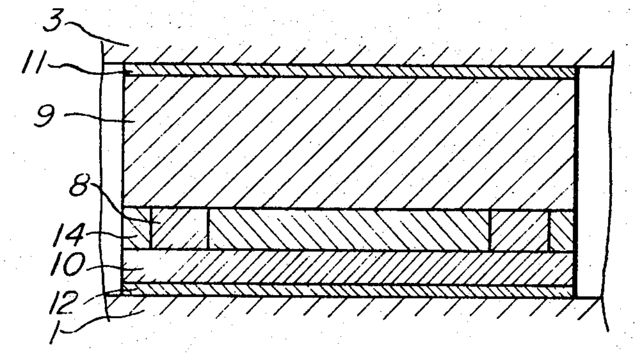

FIG. 9 shows an embodiment of a Gunn oscillator in which a ring-type layer having a suitable resistivity is embedded in a layer having a higher resistivity. 14 is a GaAs layer having a resistivity higher than the value suitable for the conventional Gunn oscillator. 8 is a ring-like region having a resistivity suitable for the Gunn oscillator and is obtained by diffusion to penetrate the layer 14. In this emodiment, during operation the layer 14 acts substantially as an insulating layer and the region 8 becomes an active region.

In the two embodiments here above the filled body structure is used, and yet a ring-type active region is formed in operation. So, the above-mentioned advantages of this invention are retained.

The foregoing description of the embodiments of this invention has related to a Gunn oscillator. This invention can also be applied to other solid electronic devices. For example, in a microwave frequency multiplier using a varactor diode, heat is generated due to a dielectric loss of the displacement current caused by microwaves. This invention can be applied to such a case with similar functional effects and advantages as in the case of a Gunn oscillator.

When this invention is applied to an element where an active region is formed in a PN junction such as a varactor diode, the layer 8 in the embodiment shown in FIG. 5 may be replaced by a junction layer, the active region being formed only in the peripheral portion to decrease the thermal resistance. Microwaves are distributed almost uniformly in the entire portion of the active region to effect a high efficiency operation.

Further, this invention may be applied to such devices as those having a Read diode, an avalanche diode and a switching diode interacting with microwaves. The rise in temperature of the diode is decreased, and the output and the efficiency are increased.

Although description has been made of some preferred embodiments of this invention, many alterations and modifications may be made by those skilled in the art without departing from the spirit and scope of this invention.

We claim:

1. A microwave semiconductor device comprising a semiconductor element body having a layer interacting with microwaves and a region interrupting substantially a current flowing through said element body during operation in at least one portion of the central portion of said body;

a heat sink joined to said body to dissipate the heat generated in said body; and a means giving a voltage to said body to make it interact with microwaves, thereby forming in the peripheral portion of said body an active region interacting with microwaves.

2. A microwave semiconductor device according to claim 1, wherein said region substantially interrupting the current flowing through said body during operation is eliminated to make the portion of said element body containing said region hollow.

3. A microwave semiconductor device according to claim 1, wherein said region substantially interrupting the current flowing through said body during operation is made of semiconductor material having a large resistivity to be substantially an insulating region for said current.

4. A microwave semiconductor device according to claim 1, wherein the interaction between said element body and microwaves is the generation of microwaves from said element body.

5. A microwave semiconductor device according to claim 1, wherein the interaction between said element body and microwaves is the frequency conversion of microwaves by said element body.

6. A microwave semiconductor device according to claim 1, wherein said layer interacts with microwaves in the bulk of said layer.

7. A microwave semiconductor device according to claim 6, wherein said layer interacting with microwaves is made of GaAs.

8. A microwave semiconductor device according to claim 1, wherein said layer interacting with microwaves is a junction layer.

9. A microwave semiconductor device according to claim 8, wherein said semiconductor element body having said junction layer is selected from the group of a varactor diode, a Read diode, an avalanche diode, and a switching diode.

No references cited.

JOHN KOMINSKI, Primary Examiner

U.S. Cl. X.R.

317—234